(12) United States Patent
Dunn

(10) Patent No.: US 8,379,182 B2
(45) Date of Patent: Feb. 19, 2013

(54) COOLING SYSTEM FOR OUTDOOR ELECTRONIC DISPLAYS

(75) Inventor: William Dunn, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 833 days.

(21) Appl. No.: 12/556,209

(22) Filed: Sep. 9, 2009

(65) Prior Publication Data
US 2010/0232107 A1    Sep. 16, 2010

Related U.S. Application Data

(63) Continuation-in-part of application No. 11/941,728, filed on Nov. 16, 2007, now Pat. No. 8,004,648, and a continuation-in-part of application No. 12/191,834, filed on Aug. 14, 2008, now Pat. No. 8,208,115, and a continuation of application No. 12/234,307, filed (Continued)

(51) Int. Cl.
G02F 1/1333    (2006.01)

(52) U.S. Cl. .......................................... 349/161; 349/58

(58) Field of Classification Search .................... 349/161
See application file for complete search history.

(56) References Cited

U.S. PATENT DOCUMENTS

| | | | |
|---|---|---|---|
| 4,093,355 A | 6/1978 | Kaplit et al. | |
| 4,593,978 A | 6/1986 | Mourey et al. | |
| 4,634,225 A | 1/1987 | Haim et al. | |
| 4,763,993 A * | 8/1988 | Vogeley et al. | 349/161 |
| 5,029,982 A | 7/1991 | Nash | |
| 5,088,806 A | 2/1992 | McCartney et al. | |
| 5,247,374 A | 9/1993 | Tereda | |
| 5,559,614 A | 9/1996 | Urbish et al. | |
| 5,767,489 A | 6/1998 | Ferrier | |
| 5,818,010 A | 10/1998 | McCann | |

(Continued)

FOREIGN PATENT DOCUMENTS

| | | |
|---|---|---|
| GB | 2402205 | 1/2004 |
| JP | 03153212 | 7/1991 |

(Continued)

OTHER PUBLICATIONS

Zeef, Hubing, EMC analysis of 18' LCD Monitor, Aug. 2000, 1 page.

Primary Examiner — Wen-Ying P Chen
(74) Attorney, Agent, or Firm — Standley Law Group LLP

(57) ABSTRACT

A cooling system for an electronic display. Transparent cooling chambers are used to extract heat from the front display surface of an electronic display. A refrigerated air source is in gaseous communication with the cooling chamber. Additional fans may be used to cool other components of the electronic display. Multiple displays may be used where each display and the refrigerated air source is housed within the housing. The housing contains air inlet and air exhaust ports. An air curtain device may be used with some embodiments. An open-loop, closed-loop, or both types of designs may be used with the cooling chambers. Temperature sensors may allow the refrigerated air source(s) to be selectively engaged depending on the temperature of the air within the cooling chamber or the temperature of the front display surface. Ambient temperature sensors may also direct the switch between open and closed loops.

20 Claims, 5 Drawing Sheets

Related U.S. Application Data on Sep. 19, 2008, and a continuation-in-part of application No. 12/234,360, filed on Sep. 19, 2008, and a continuation-in-part of application No. 12/237,365, filed on Sep. 24, 2008, and a continuation-in-part of application No. 12/411,925, filed on Mar. 26, 2009, and a continuation-in-part of application No. 12/235,200, filed on Sep. 22, 2008, and a continuation-in-part of application No. 12/234,182, filed on Sep. 19, 2008.

(60) Provisional application No. 61/095,616, filed on Sep. 9, 2008, provisional application No. 61/033,058, filed on Mar. 3, 2008, provisional application No. 61/033,064, filed on Mar. 3, 2008, provisional application No. 61/053,713, filed on May 16, 2008, provisional application No. 61/057,599, filed on May 30, 2008, provisional application No. 61/115,333, filed on Nov. 17, 2008, provisional application No. 61/039,454, filed on Mar. 26, 2008, provisional application No. 61/076,126, filed on Jun. 26, 2008.

(56) References Cited

U.S. PATENT DOCUMENTS

| | | |
|---|---|---|
| 5,869,919 A * | 2/1999 | Sato et al. .................. 313/17 |
| 5,991,153 A | 11/1999 | Heady et al. |
| 6,089,751 A | 7/2000 | Conover et al. |
| 6,157,432 A | 12/2000 | Helbing |
| 6,191,839 B1 | 2/2001 | Briley |
| 6,417,900 B1 | 7/2002 | Shin et al. |
| 6,535,266 B1 | 3/2003 | Nemeth et al. |
| 6,628,355 B1 | 9/2003 | Takahara |
| 6,839,104 B2 | 1/2005 | Taniguchi et al. |
| 6,885,412 B2 | 4/2005 | Ohnishi et al. |
| 6,943,768 B2 | 9/2005 | Cavanaugh et al. |
| 2001/0009508 A1 * | 7/2001 | Umemoto et al. ............. 362/31 |
| 2002/0101553 A1 | 8/2002 | Enomoto et al. |
| 2002/0126248 A1 | 9/2002 | Yoshida |
| 2003/0007109 A1 | 1/2003 | Park |
| 2004/0036834 A1 | 2/2004 | Ohnishi et al. |
| 2004/0165139 A1 | 8/2004 | Anderson et al. |
| 2006/0132699 A1 | 6/2006 | Cho et al. |
| 2006/0209266 A1 | 9/2006 | Utsunomiya |
| 2007/0151664 A1 | 7/2007 | Shin |

FOREIGN PATENT DOCUMENTS

| | | |
|---|---|---|
| JP | 08194437 | 7/1996 |
| JP | 11160727 | 6/1999 |
| JP | 2002158475 | 5/2002 |
| JP | 2005134849 | 5/2005 |
| KR | 1020070070675 | 7/2007 |
| WO | WO2005079129 | 8/2005 |

* cited by examiner

COOLING SYSTEM FOR OUTDOOR ELECTRONIC DISPLAYS

CROSS-REFERENCE TO RELATED APPLICATIONS

This application is a non-provisional application of U.S. Application No. 61/095,616 filed Sep. 9, 2008 and is hereby incorporated by reference. This application is also a continuation in part of U.S. patent application Ser. No. 11/941,728 filed Nov. 16, 2007, which is hereby incorporated by reference in its entirety. This application is also a continuation in part of U.S. patent application Ser. No. 12/191,834 filed Aug. 14, 2008, which claims priority to U.S. Application No. 61/033,058 filed Mar. 3, 2008 each of which is hereby incorporated by reference in its entirety. This application is also a continuation in part of U.S. patent application Ser. No. 12/234,307 filed Sep. 19, 2008, which claims priority to U.S. Application No. 61/033,064 filed Mar. 3, 2008 each of which is hereby incorporated by reference in its entirety. This application is also a continuation in part of U.S. patent application Ser. No. 12/234,360 filed Sep. 19, 2008, which claims priority to U.S. Application No. 61/053,713 filed May 16, 2008 each of which is hereby incorporated by reference in its entirety. This application is also a continuation in part of U.S. patent application Ser. No. 12/237,365 filed Sep. 24, 2008, which claims priority to U.S. Application No. 61/057,599 filed May 30, 2008 each of which is hereby incorporated by reference in its entirety. This application is a non-provisional application of U.S. Application No. 61/115,333 filed Nov. 17, 2008 and is hereby incorporated by reference. This application is also a continuation in part of U.S. patent application Ser. No. 12/411,925 filed Mar. 26, 2009, which claims priority to U.S. Application No. 61/039,454 filed Mar. 26, 2008 each of which is hereby incorporated by reference in its entirety. This application is also a continuation in part of U.S. patent application Ser. No. 12/235,200 filed Sep. 22, 2008, which claims priority to U.S. Application No. 61/076,126 filed Jun. 26, 2008 each of which is hereby incorporated by reference in its entirety. This application is also a continuation in part of U.S. patent application Ser. No. 12/234,182 filed Sep. 19, 2008, which claims priority to U.S. Application No. 61/033,064 filed Mar. 3, 2008 each of which is hereby incorporated by reference in its entirety.

TECHNICAL FIELD

The exemplary embodiments herein generally relate to cooling systems and in particular to cooling systems for electronic displays.

BACKGROUND OF THE ART

Conductive and convective heat transfer systems for electronic displays generally attempt to remove heat from the electronic components in a display through rear sidewalls of the display. In order to do this, the systems of the past have relied primarily on fans for moving air past the components to be cooled and eventually out of the display. In some cases, the heated air is moved into thermal communication with fins. Some of the past systems also utilize conductive heat transfer from heat producing components directly to heat conductive housings for the electronics. In these cases, the housings have a large surface area, which is in convective communication with ambient air outside the housings. Thus, heat is transferred convectively or conductively to the housing and is then transferred into the ambient air from the housing by natural convection.

While such heat transfer systems have enjoyed a measure of success in the past, improvements to displays as well as their use in outdoor environments requires even greater cooling capabilities.

SUMMARY OF THE EXEMPLARY EMBODIMENTS

In particular, cooling devices for electronic displays of the past have generally used convective heat dissipation systems that function to cool the rear interior of the display by one or more fans and fins. When a display is used outdoors, previous systems are not adequate in many climates, especially due to the greater heat production from larger outdoor displays and/or radiative heat transfer from the sun through a display window becomes a major factor. In many applications 200 Watts or more through such a display window is common. Furthermore, the market is demanding larger screen sizes for displays. An increase in the display screen size results in an increased area for the rays of the sun to contact. This increased size results in more heat being generated and more heat being transmitted into the displays through the display surfaces. Large electronic displays which are used outdoors also require a correspondingly larger illumination device (eg. backlight) in order to illuminate the larger display area so that it may be viewed in direct sunlight. These larger illumination devices also generate more heat than the smaller, indoor versions.

A large fluctuation in temperature adversely affects the electronic components in these devices, both in terms of performance and lifetime. The embodiments herein have made consistent cooling possible for electronic displays having large screen sizes and used outdoors even in direct sunlight. For example, cooling of a display utilizing a 70 inch screen can be achieved, even in extremely hot climates and in direct sunlight.

A preferred embodiment may include a refrigerated air source in gaseous communication with a transparent cooling chamber that allows refrigerated air to contact a viewable display surface while impacting the viewable aspects of the display only minimally. The refrigerated air is used to remove heat from the front (viewable) portion of an electronic display. The refrigerated air source may ingest air from the ambient air surrounding the housing, reduce the temperature of the ingested air, and circulate the cool ingested air into the cooling chamber in order to cool the display. After absorbing heat from the display devices, the air may then be expelled to the atmosphere, either out of the display housing or across the exterior front surface of the display to further cool the front display surface (also known as an 'air curtain'). Thus, some displays may include an optional air curtain device for further cooling capabilities, such as the subject matter of co-pending U.S. application Ser. No. 11/941,728, filed on Nov. 16, 2007 and herein incorporated by reference in its entirety.

Other embodiments may use the ingested ambient air only to cool the components of the refrigerated air source and then exhaust the air once it has absorbed heat from one or more components of the refrigerated air source. In these embodiments, a closed-loop cooling method is used where the refrigerated air source ingests air from the cooling chamber rather than from the surrounding ambient air. The refrigerated air is then forced through the cooling chamber and re-circulated into the refrigerated air source to be re-cooled and re-introduced into the cooling chamber. Some embodiments may be capable of both cooling methods: re-circulating the cooling air (closed loop) and refrigerating ambient air and then exhausting it (open loop).

A preferred embodiment is a multi-sided housing with the viewable area of two or more electronic displays forming sides of the housing, where one side of the housing may define an optional access door to access the interior of the housing. At least one refrigerated air source may be within the housing. The electronic displays may share a single refrigerated air source or there may be a refrigerated air source for each display.

In certain embodiments, the system may also include a filtering mechanism for removing particulate from the cooling air. Electrically-charged surfaces in cooling devices can sometimes act as electrostatic filters for particles in the surroundings. The accumulation of particles on these electrostatically-charged surfaces has an adverse effect on electronic devices. The accumulation of particulate matter can make heat dissipation less efficient and can reduce performance and lifetime and may necessitate undue maintenance. Thus it may be advantageous to include a filter in the housing or the refrigerated air source.

Optionally, an additional cooling system may be included within the housing of the display if further cooling capability is desired. This additional cooling system may be positioned to provide a flow of air within the interior of the housing. This flow of air may be used to remove the heat generated by some of the internal electronics of the displays (ex. backlights and/or power modules, if used). This optional system may simply use ingested ambient air to cool these electronics or may use refrigerated air.

The display and system may include temperature sensors, where the cooling air and/or refrigerated air source is selectively engaged when the temperature within the display reaches a threshold value. For embodiments which are capable of both open-loop and closed-loop cooling, temperature sensors can allow the system to switch between each mode depending on the relative temperatures of the air within the transparent cooling chamber and the ambient air.

The foregoing and other features and advantages of the present invention will be apparent from the following more detailed description of the particular embodiments of the invention, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION OF A PREFERRED EMBODIMENT

Figure 1:
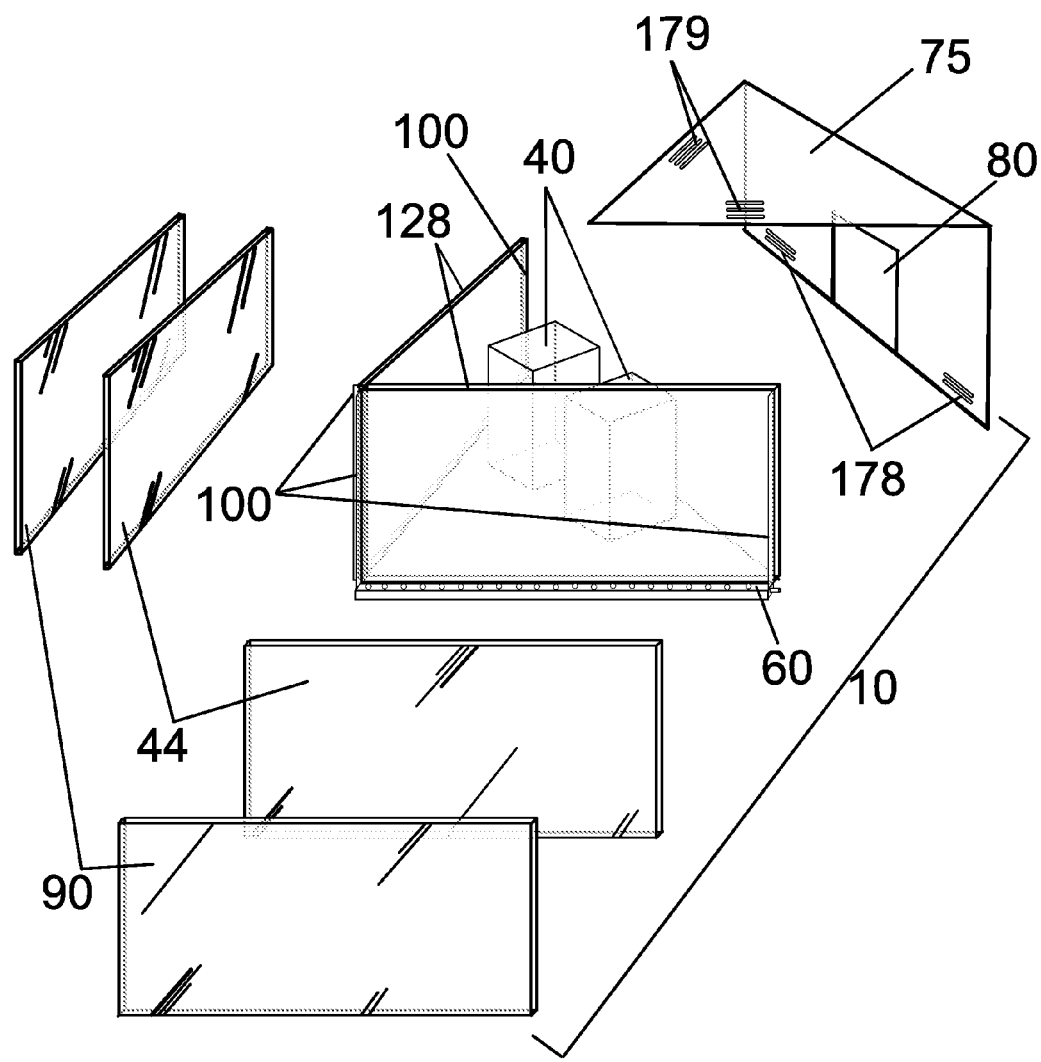
FIG. 1 is an exploded perspective view of an exemplary embodiment utilizing two electronic displays and two refrigerated air sources.

FIG. 1 demonstrates a preferred embodiment. It is an exploded perspective view of the display unit 10, which contains one or more electronic display surfaces 128, a housing 75, one or more refrigerated air sources 40, entrance manifolds 60 for refrigerated air, a transparent front plate 44, air inlet apertures 178, air exhaust apertures 179, and optional second transparent front plate 90. An electronic display surface 128, transparent front plate 44, and spacing members 100 may combine to produce a cooling chamber. The spacing members 100 may be used to define the depth of the cooling chamber. The spacing members 100 may be separate components, or may be integral with the transparent front plate 44, the display surface 128, or the housing 75. A refrigerated air source 40 may be in gaseous communication with the cooling chamber through an entrance manifold 60. An access panel 80 may be provided in the housing 75 so that internal components can be accessed and possibly serviced/replaced. The term 'manifold' as used herein represents a device which alters the cross-sectional shape of an air flow.

Figure 2:
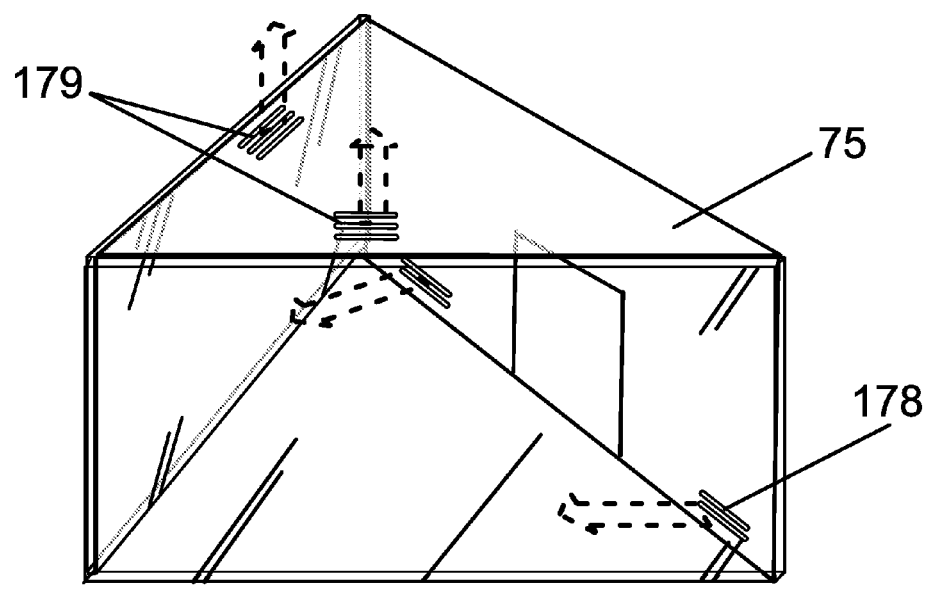
FIG. 2 is a perspective view of the housing showing the inlet and exhaust air apertures.

FIG. 2 provides an isometric view of the housing 75. Here, the dashed arrows show the flow of ambient air into the air inlet apertures 178 as well as exhaust air out of the air exhaust apertures 179. As mentioned above, the inlet/exhaust air can be used in a variety of ways. The refrigerated air source 40 may ingest air from the ambient air surrounding the housing, reduce the temperature of the ingested air, and circulate the cool ingested air into the cooling chamber in order to cool the display. After absorbing heat from the display, the air may then be expelled to the atmosphere, either out of the air exhaust apertures 179 or across the exterior front surface of the display to further cool the display (also known as an 'air curtain'). Other embodiments may ingest ambient air through the air inlet apertures 178 in order to cool the components of the refrigerated air source and exhaust the ingested air out of the air exhaust apertures 179 once it has absorbed heat from components of the refrigerated air source. In these embodiments, once the refrigerated air has been forced through the cooling chamber, it is then re-circulated into the refrigerated air source to be re-cooled and re-introduced into the cooling chamber.

It should be noted that although the inlet 178 and exhaust 179 apertures are shown in FIG. 2 in certain locations on the housing 75 that they may be placed in any location that would provide adequate supply and removal of cooling air. In an exemplary embodiment the two apertures would not be in similar locations to avoid ingesting hot air which was previously exhausted by the display.

Figure 3:
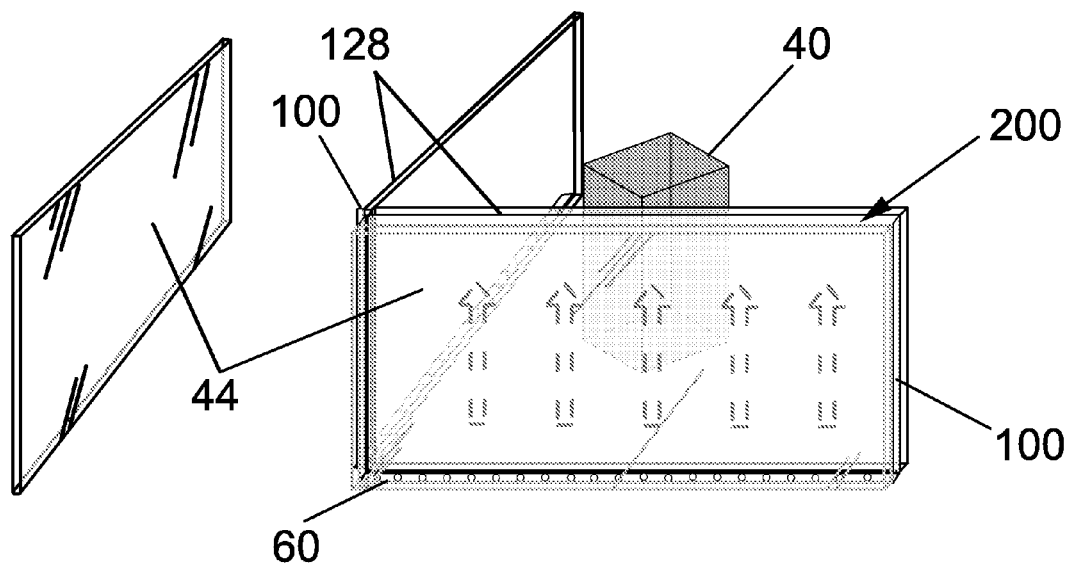
FIG. 3 is a perspective view showing the flow of refrigerated air (shown by dashed arrows) through the cooling chamber.

FIG. 3 depicts the flow of refrigerated air (shown by dashed arrows) generated by the refrigerated air source 40, through the cooling chamber 200. The cooling chamber 200 may be in gaseous communication with the refrigerated air source 40 through the entrance manifold 60. As discussed above, the cooling chamber 200 may comprise the electronic display surface 128, a front transparent plate 44 mounted in front of the electronic display surface 128, and the spacing members 100. The spacing members 100 may extend vertically along the side edges of the cooling chamber 200. When used in this way, the spacers may form the sidewalls of the cooling chamber 200. The depth, of the cooling chamber 200 may correspond to the thickness of spacers 100. The depth of the cooling chamber 200 may be adjusted as required for the particular application so that the proper type (ex. laminar) and amount of flow may be achieved. It should be noted, that although the refrigerated air is shown here as flowing vertically, it may also flow horizontally (and the spacers may run horizontally as well). Different orientations may be used to suit any particular environment for the displays, type of displays, and orientation of the overall display unit 10.

Figure 4:
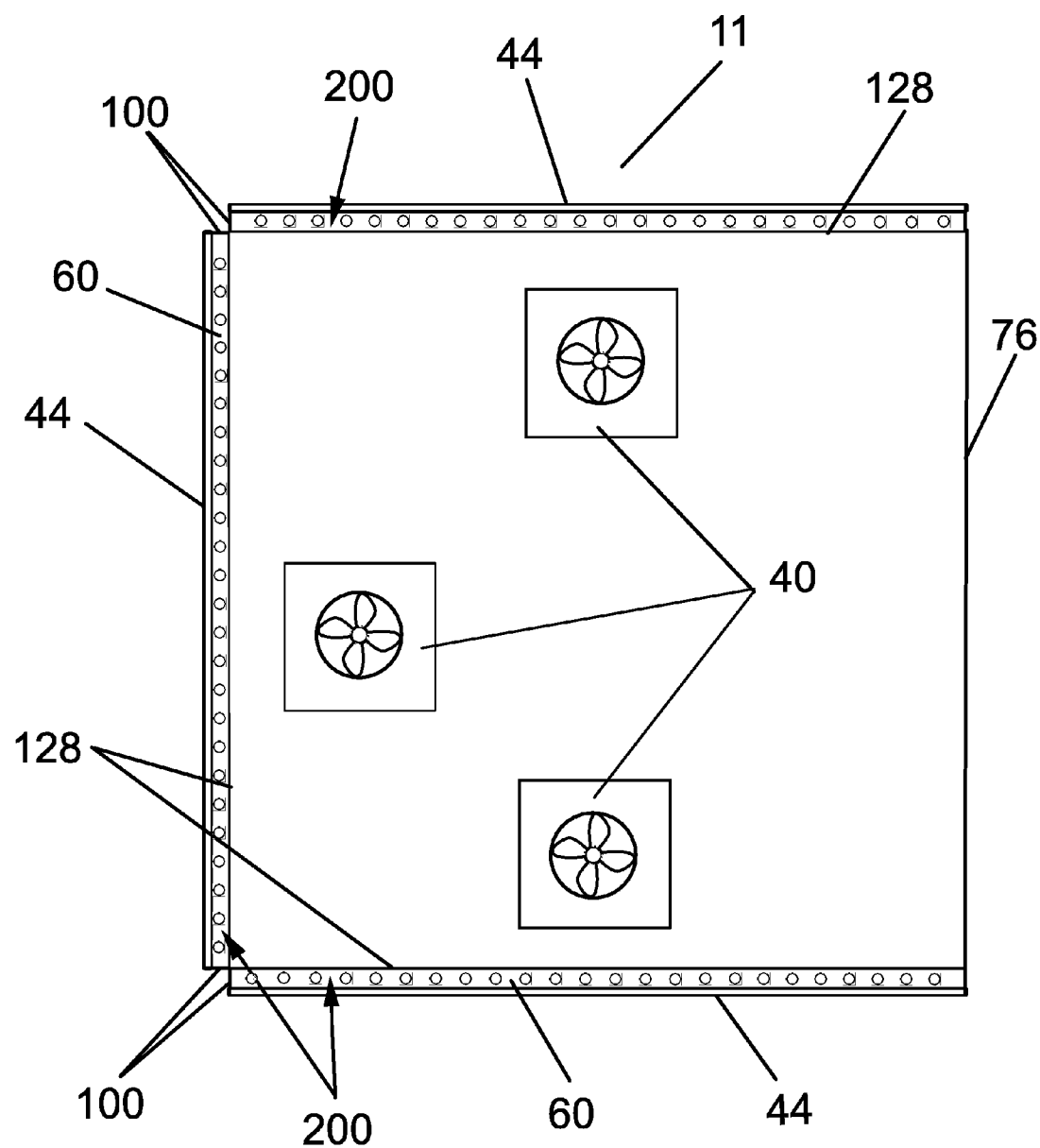
FIG. 4 is a top view of an embodiment using three displays arranged adjacent to one another, and the housing defining the fourth side of a four-sided unit.

FIG. 4 is a top view of another embodiment 11. It demonstrates an embodiment with three display surfaces 128 arranged adjacent to one another, and the housing defining the fourth side 76 of a four-sided unit. It also may include a refrigerated air source 40 for each electronic display. Alternatively, the displays may share a single refrigerated air source 40. Many variations on this embodiment can be practiced by those skilled in the art. For example, the fourth side of the unit 76 may operate as an access door but may simultaneously comprise a static advertising display (which may or may not be backlit). Alternatively, the fourth side of the unit 76 may contain a fourth electronic display which may be fixed in relation to the other displays or may be hinged so that it can still provide access to the interior of the unit. Other embodiments may also contain more than four sides. Other embodiments may have four sides with only two displays, where the displays are placed on opposing sides of the four sided housing.

Figure 5:
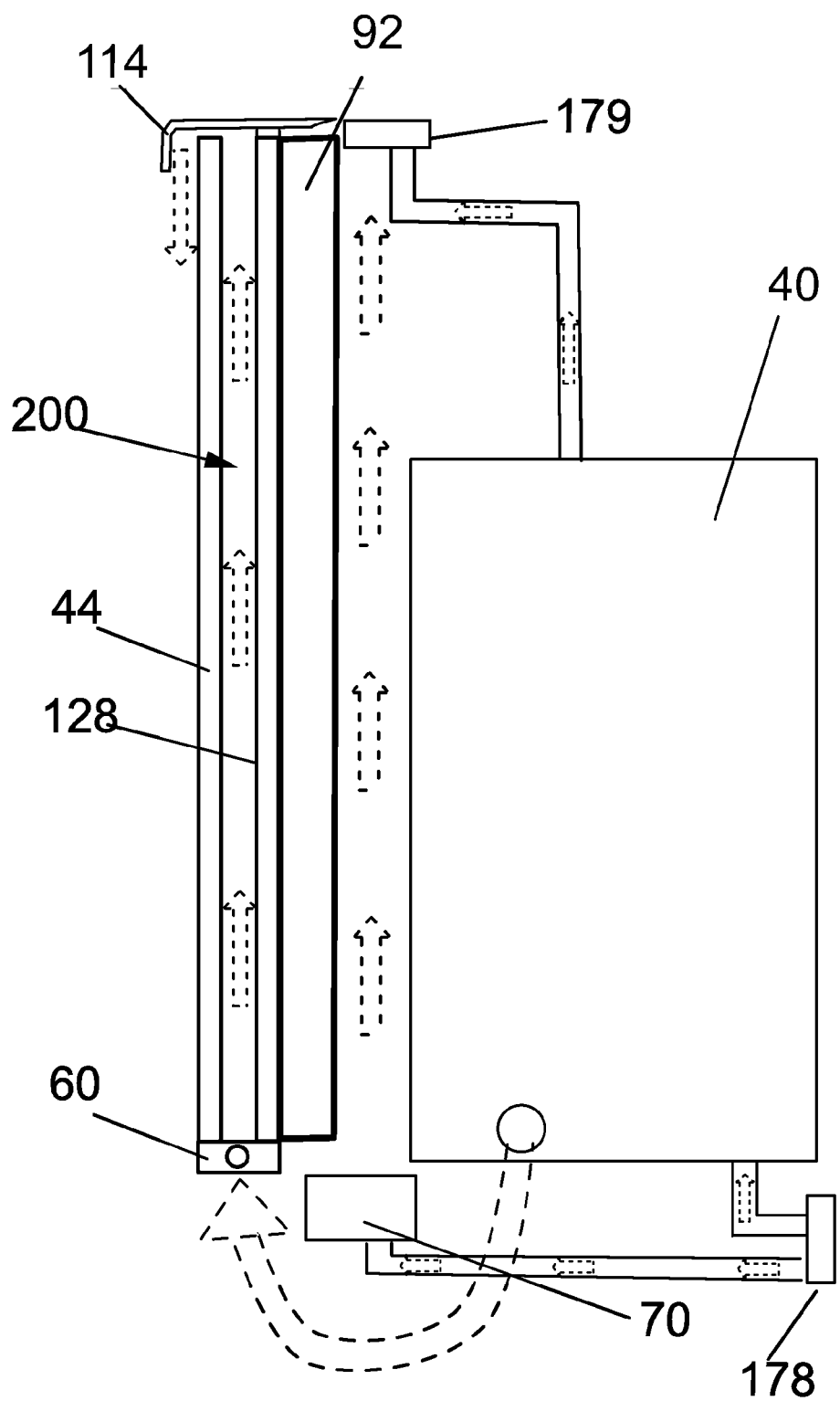
FIG. 5 is a side view of an embodiment which uses an optional air curtain device as well as an additional cooling fan for cooling the interior of the display.

FIG. 5 provides a side view of an embodiment which uses an optional air curtain device 114 as well as an additional cooling fan 70. In the embodiment shown, ambient air may be drawn through an air inlet aperture 178 and into the refrigerated air source 40 where it may be cooled. This cooled air is then directed into the entrance manifold 60 and between the display surface 128 and the transparent front plate 44. In this embodiment, once the air has passed through the cooling chamber 200 it is then directed across the exterior surface of the transparent front plate 44 using an air curtain device 114. Thus, some displays may include an optional air curtain device for further cooling capabilities, such as the subject matter of co-pending U.S. application Ser. No. 11/941,728, filed on Nov. 16, 2007 and herein incorporated by reference in its entirety. The refrigerated air source 40 may also use the ingested ambient air from the air inlet aperture 178 to cool components of the refrigerated air source 40 (ex. compressors and/or a condensing coil). This air may then be directed towards an air exhaust aperture 179.

Also shown in this embodiment is an additional cooling fan 70 which may be used to cool one or more surfaces of an electronic display 92 or other electronic components such as power modules, printed circuit boards, motors, and/or backlight assemblies. In an exemplary embodiment, the additional cooling fan 70 would force ingested air from an air inlet aperture 178 across a rear surface of an LED-backlight for an LCD. In alternative embodiments, the additional cooling fan 70 would draw the air across the display 92 rather than push it across the display 92 (i.e. the additional cooling fan 70 would be placed at the top of the display rather than at the bottom of the display). Other embodiments may use fans at both the bottom and top of the display (to both push and draw air through). Once this air has passed over the electronic display or other electronic components it may exit the housing through an air exhaust aperture 179. In other embodiments, this air may be refrigerated prior to directing it across one or more surfaces of an electronic display 92 or other electronic components such as power modules, printed circuit boards, motors, and/or backlight assemblies.

It should be noted that although some of the air is shown as flowing through enclosures or ducts, this is not required in any embodiment. For example, the ambient air which is ingested through inlet aperture 178 and travels to the refrigerated air source 40 and the additional cooling fan 70 does not necessarily travel through an enclosure or a duct. While this may be preferable in some embodiments, the enclosures were shown in FIG. 5 for clarification of the airway paths.

Figure 6:
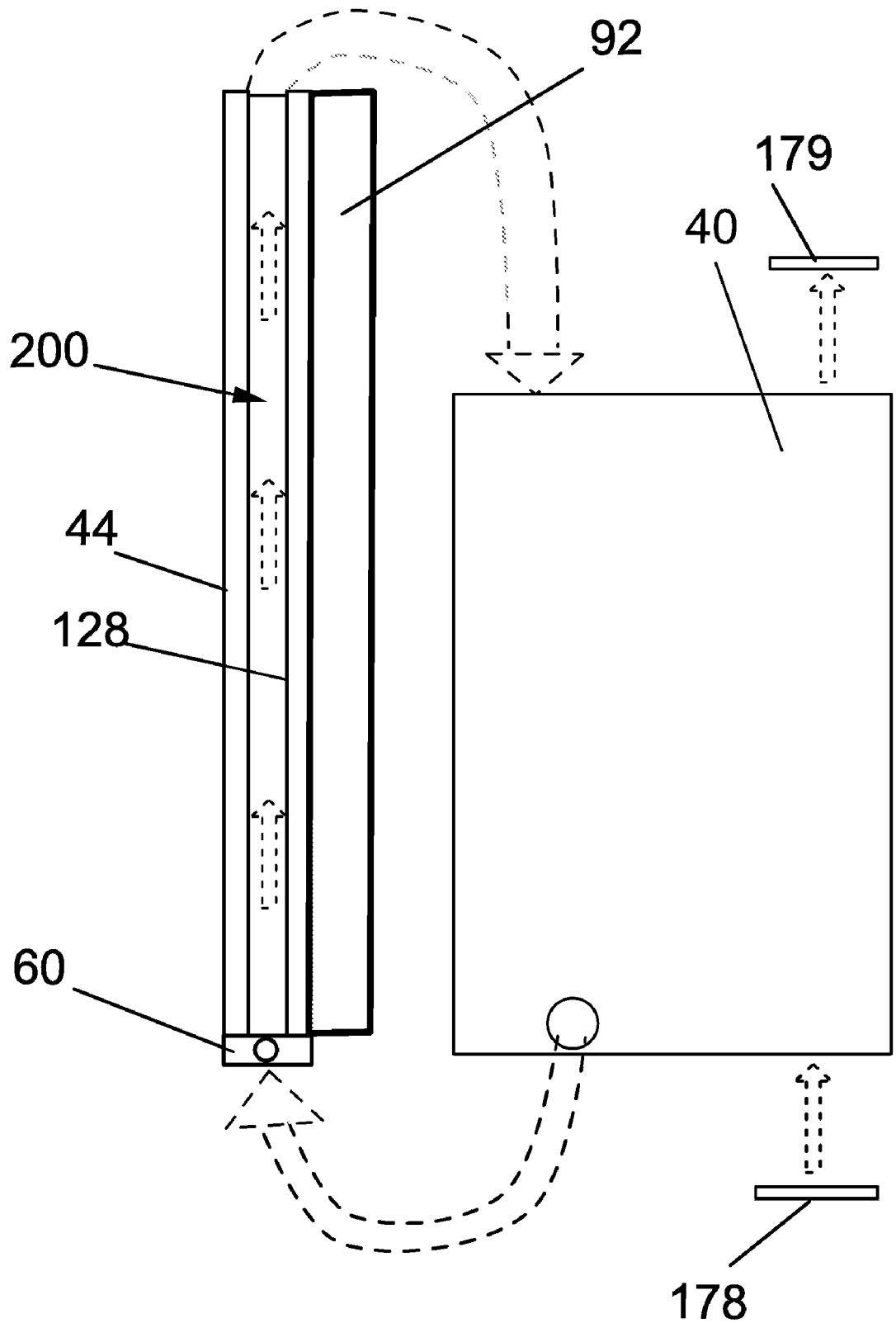
FIG. 6 is a side view of an embodiment which uses a closed-loop cooling design.

FIG. 6 provides a side view of an embodiment which re-circulates the air that is directed through the cooling chamber 200. In this embodiment, refrigerated air is directed from the refrigerated air source 40 into the entrance manifold 60 and between the display surface 128 and the transparent front plate 44. Once the air has passed through the cooling chamber 200, it is re-directed into the refrigerated air source 40 to be re-cooled and re-directed into the cooling chamber 200. As the air exits the cooling chamber 200 it may be collected with an exit manifold and re-directed into the refrigerated air source 40. Thus, this embodiment could be considered a closed-loop cooling system. The refrigerated air source 40 may draw ambient air through the air intake aperture 178 in order to cool components of the refrigerated air source 40 (ex. compressors or a condensing coil). This air may then be directed towards an air exhaust aperture 179.

Preferred embodiments use the electronic display surface 128 as the internal surface of the cooling chamber 200. As the refrigerated air contacts the electronic display surface 128, heat is transferred from the electronic display surface 128 to the air. Therefore, in this context, the term "electronic display surface" means any front surface of a typical electronic display. Some embodiments may use the front viewable surface (the final surface necessary to produce an image) as the electronic display surface. Other embodiments may use a protective front plate as the electronic display surface. An electronic display may contain a protective front plate which does not aid in the production of an image, but is simply used to protect the sensitive internal components of the display and may also provide anti-reflection, polarization, or phase retardation properties. Some embodiments may utilize this protective front plate as the electronic display surface 128. Other embodiments may remove the protective front plate from a typical display and use whatever surface may be behind the protective front plate as the electronic display surface 128. Some embodiments may use the front polarizer of an LCD as the electronic display surface 128. Exemplary embodiments may use the front viewable surface of the display, where by using the front viewable surface as the internal surface wall of the cooling chamber 200, heat may be more effectively transferred from the display itself and there may be fewer surfaces to impact the visible light traveling through the display. Furthermore, the entire device will be lighter and cheaper to manufacture. However, some embodiments may attach further layers to the protective front plate, and these further layers may provide the electronic display surface. Various embodiments may be practiced depending on whether the particular display system is a retro-fit for existing displays or is specifically manufactured for use with the cooling system described herein.

The electronic display surface 128 of an exemplary display may be a glass substrate; however, neither plate 44, surface 128, nor plate 90 need necessarily be glass. Although the embodiment shown utilizes the electronic display surface 128 as the internal surface wall of the cooling chamber 200, certain modifications and/or coatings (e.g., index matching dielectrics, polarizers, phase retarders, etc.) may be added to the electronic display surface 128, or to other components of the system in order to improve thermal regulation or to improve the optical performance of the device. In an exemplary embodiment, the electronic display surface 128 may be the front glass plate of a liquid crystal display stack, possibly including the front polarizer. However, any display surface may be suitable for embodiments of the present cooling system.

The cooling system may also include a filter for removing particulate matter (e.g. dust, pollen, smoke, insects, etc.) before it can enter the cooling chamber. The filter should be positioned such that it will remove particulate matter from the cooling air prior to the airflow entering the cooling chamber 200.

In order to further reduce the solar loading on the display, a linear polarizer may be placed on one surface of the front transparent plate 44. If the display is an LCD, then this would be in addition to the first and second polarizers that are typically used to surround an LCD stack.

If desired, one or more temperature sensors (not shown) and a switch (not shown) may be incorporated within the display unit 10. The temperature sensor may be used to detect when temperatures have reached a predetermined threshold value. When this occurs the cooling system can be selectively engaged. Predetermined thresholds may be selected and the system may be configured with a thermostat (not shown) to advantageously keep the display at a relatively constant temperature, or at least within a range of acceptable temperatures. Alternatively, to avoid the need for a thermostat, the cooling system may run continuously when the electronic display 10 is operational.

As mentioned above, some embodiments may be setup for both closed-loop and open-loop use. For example, by measuring the temperature of the ambient air and comparing this to the temperature of the air exiting the cooling chamber, it can be determined which orientation (open-loop or closed-loop) would be more efficient. Thus, if the ambient air is cooler than the air within the cooling chamber, it would be more efficient to use ambient air as the source for the air within the cooling chamber (i.e. ingest ambient air into the refrigeration source for cooling and forcing into the cooling chamber). Alternatively, if the ambient air is warmer than the air within the cooling chamber, it would be more efficient to re-circulate the air within the cooling chamber (i.e. ingest the air which is exiting the cooling chamber back into the refrigeration unit for cooling and re-introduction into the cooling chamber). It should be noted that in both setups it may be necessary to ingest ambient air in order to cool one or more mechanisms within the refrigerated air source.

It is to be understood that the spirit and scope of the disclosed embodiments includes cooling of displays including, but not limited to LCDs. By way of example and not by way of limitation, the exemplary embodiments may be used in conjunction with displays selected from among LCD, light emitting diode (LED), organic light emitting diode (OLED), field emitting display (FED), light-emitting polymer, electroluminescence, cathode ray tube (CRT), and plasma displays. Furthermore, embodiments may be used with displays of other types including those not yet discovered as any display that is placed in sunlight and/or warm ambient temperatures will require the removal of heat from the front viewable surface. In particular, it is contemplated that the present invention may be well suited for use with full color, flat panel OLED displays as well as LED-backlit LCD displays. While the embodiments described herein are well suited for outdoor environments, they may also be appropriate for indoor applications (e.g., factory environments) where thermal stability of the display may be at risk.

It should also be noted that although the embodiments herein have been shown with displays in landscape orientation, the various embodiments herein can be practiced with any display orientation. Thus, displays which are in portrait orientation, landscape orientation, or square may be used with the embodiments herein.

Having shown and described a preferred embodiment of the invention, those skilled in the art will realize that many variations and modifications may be made to affect the described invention and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

The invention claimed is:

1. A cooling system for an electronic display having a display surface and electronic components, the cooling system comprising:
   a transparent cooling chamber placed adjacent to the display surface, the chamber having a first and second opening and a transparent front plate;
   a refrigerated air source in gaseous communication with the first opening of the transparent cooling chamber; and
   a manifold in gaseous communication with the first opening of the cooling chamber which contains a plurality of apertures to distribute cooling air from the refrigerated air source across the display surface.

2. The cooling system from claim 1 further comprising:
   an air curtain device in gaseous communication with the second opening of the chamber.

3. The cooling system from claim 1 further comprising:
   a fan directing ambient air across at least one electronic component of the electronic display.

4. The cooling system from claim 1 further comprising:
   a fan in gaseous communication with the refrigerated air source and directing refrigerated air across at least one electronic component of the display.

5. The cooling system from claim 1 further comprising:
   a linear polarizer placed between the transparent front plate and the electronic display.

6. A display system comprising:
   first and second electronic displays placed adjacent to one another, both displays having display surfaces and electronic components;
   a first cooling system attached to the first electronic display and comprising
      a transparent cooling chamber placed adjacent to the display surface, the chamber having a first and second opening and a transparent front plate and
      a refrigerated air source in gaseous communication with the first opening of the transparent cooling chamber;
   a second cooling system attached to the second electronic display and comprising
      a transparent cooling chamber placed adjacent to the display surface, the chamber having a first and second opening and a transparent front plate and
      a refrigerated air source in gaseous communication with the first opening of the transparent cooling chamber;
   a housing which enclosed the displays and the cooling systems;
   an access door within the housing; and
   air inlet and air exhaust apertures within the housing.

7. The display system from claim 6 further comprising:
   a first fan directing ambient air from the air inlet aperture across at least one electronic component of the first electronic display; and
   a second fan directing ambient air from the air inlet aperture across at least one electronic component of the second electronic display.

8. The display system from claim 6 further comprising:
a first fan in gaseous communication with the refrigerated air source of the first cooling system and directing refrigerated air across at least one electronic component of the first electronic display; and
a second fan in gaseous communication with the refrigerated air source of the second cooling system and directing refrigerated air across at least one electronic component of the second electronic display.

9. The display system from claim 6 further comprising:
a pair of exit manifolds, a first of which in gaseous communication with the second opening of the chamber and the refrigerated air source of the first cooling system, a second of which in gaseous communication with the second opening of the chamber and the refrigerated air source of the second cooling system.

10. The display system from claim 9 further comprising:
a first temperature sensor within the chamber of the first cooling system, wherein the refrigerated air source sends refrigerated air to the entrance manifold when the temperature within the first chamber reaches a threshold value; and
a second temperature sensor within the chamber of the second cooling system, wherein the refrigerated air source sends refrigerated air to the entrance manifold when the temperature within the second chamber reaches a threshold value.

11. A display system comprising:
a first electronic display having a display surface and electronic components;
a first cooling system attached to the first electronic display comprising:
 a transparent plate placed in front of the display surface,
 a pair of spacing members between the transparent plate and the display surface, where the spacing members, transparent plate and front display surface form a chamber having a first and second opening,
 an entrance manifold in gaseous communication with the first opening of the chamber;
a second electronic display having a display surface and electronic components;
a second cooling system attached to the second electronic display:
 a transparent plate placed in front of the display surface,
 a pair of spacing members between the transparent plate and the display surface, where the spacing members, transparent plate and front display surface form a chamber having a first and second opening, and
 an entrance manifold in gaseous communication with the first opening of the chamber;
a refrigerated air source in gaseous communication with the entrance manifolds of the first and second cooling systems;
a housing which enclosed the displays and the cooling systems; and
air inlet and air exhaust apertures within the housing.

12. The display system from claim 11 further comprising:
a first exit manifold in gaseous communication with the second opening of the chamber of the first cooling system;
a second exit manifold in gaseous communication with the second opening of the chamber of the second cooling system; and
wherein both the first and second exit manifolds are also in gaseous communication with the refrigerated air source.

13. The display system from claim 11 further comprising:
an additional transparent plate attached to the transparent plate of the first cooling system; and
an additional transparent plate attached to the transparent plate of the second cooling system.

14. The display system from claim 11 further comprising:
a first fan directing ambient air from the air inlet aperture across the electronic components of the first electronic display; and
a second fan directing ambient air from the air inlet aperture across the electronic components of the second electronic display.

15. The display system from claim 11 further comprising:
a first linear polarizer placed behind the transparent plate of the first cooling system; and
a second linear polarizer placed behind the transparent plate of the second cooling system.

16. The display system from claim 11 further comprising:
a first fan in gaseous communication with the refrigerated air source and directing refrigerated air across the electronic components of the first electronic display; and
a second fan in gaseous communication with the refrigerated air source and directing refrigerated air across the electronic components of the second electronic display.

17. The display system from claim 11 further comprising:
an access door within the housing.

18. The display system from claim 11 further comprising:
a first temperature sensor within the chamber of the first cooling system, wherein the refrigerated air source sends refrigerated air to the entrance manifold when the temperature within the first chamber reaches a threshold value; and
a second temperature sensor within the chamber of the second cooling system, wherein the refrigerated air source sends refrigerated air to the entrance manifold when the temperature within the second chamber reaches a threshold value.

19. The display system from claim 11 further comprising:
a first exit manifold in gaseous communication with the second opening of the chamber of the first cooling system;
a second exit manifold in gaseous communication with the second opening of the chamber of the second cooling system; and
wherein both the first and second exit manifolds are also in gaseous communication with the exhaust air aperture.

20. The display system from claim 11 further comprising:
a first air curtain device in gaseous communication with the second opening of the chamber of the first cooling system; and
a second air curtain device in gaseous communication with the second opening of the chamber of the second cooling system.

* * * * *